United States Patent [19]
Iseki et al.

[11] Patent Number: 5,818,113
[45] Date of Patent: Oct. 6, 1998

[54] SEMICONDUCTOR DEVICE

[75] Inventors: Yuji Iseki; Yasushi Shizuki; Hiroshi Yamada; Takashi Togasaki; Kunio Yoshihara, all of Yokohama, Japan

[73] Assignee: Kabushiki Kaisha Toshiba, Kawasaki, Japan

[21] Appl. No.: 713,846

[22] Filed: Sep. 12, 1996

[30] Foreign Application Priority Data

Sep. 13, 1995 [JP] Japan ................................. 7-235422

[51] Int. Cl.⁶ .......................... H01L 23/48; H01L 23/52; H01L 29/40
[52] U.S. Cl. .......................... 257/778; 257/777; 257/737; 257/738; 257/783
[58] Field of Search ...................... 257/777, 778, 257/779, 522, 571, 791, 793, 737, 738, 783, 697

[56] References Cited

U.S. PATENT DOCUMENTS

| | | | |
|---|---|---|---|
| 3,429,040 | 2/1969 | Miller | 257/778 |
| 3,577,285 | 5/1971 | Rutz | 257/522 |
| 3,621,564 | 11/1971 | Tanaka et al. | 257/778 |
| 4,323,914 | 4/1982 | Berndlmaier et al. | 257/737 |
| 4,710,798 | 12/1987 | Marcantonio | 257/777 |
| 5,319,237 | 6/1994 | Legros | 257/522 |
| 5,538,754 | 7/1996 | Sandock . | |
| 5,557,149 | 9/1996 | Richards et al. | 257/777 |
| 5,629,566 | 5/1997 | Doi et al. | 257/778 |

FOREIGN PATENT DOCUMENTS 58-134449 8/1983 Japan ..................................... 257/778

OTHER PUBLICATIONS

IEEE 1994 MTT–S Digest, pp. 1763–1766, TH4E–3, "A Novel Millimeter–Wave IC on Si Substrate Using Flip–Chip Bonding Technology;" H. Sakai et al.; 1994.

Proceedings of the 1995 IEICE General Conference, C–448 "A Flip–Chip Assembly Technology Suitable For Power Amplifier MMIC;" N. Kakimoto et al.; 1995.

*Primary Examiner*—Sara W. Crane
*Assistant Examiner*—Phat X. Cao
*Attorney, Agent, or Firm*—Oblon, Spivak, McClelland, Maier & Neustadt, P.C.

[57] ABSTRACT

A semiconductor device wherein a sealing resin is filled in a space between an interconnecting wiring board and a semiconductor chip after the semiconductor chip is flip chip-mounted on the wiring board in which at least a non-planar region consisting of a through hole, a concave portion or a convex portion, or a region exhibiting poor wettability to the sealing resin is formed on the surface of the wiring board or the semiconductor chip so as to provide a void in the sealed resin filled between the wiring board and the semiconductor chip for the purpose of minimizing any bad influence from the sealing resin on the interconnecting wirings or elements formed on the semiconductor chip.

24 Claims, 4 Drawing Sheets

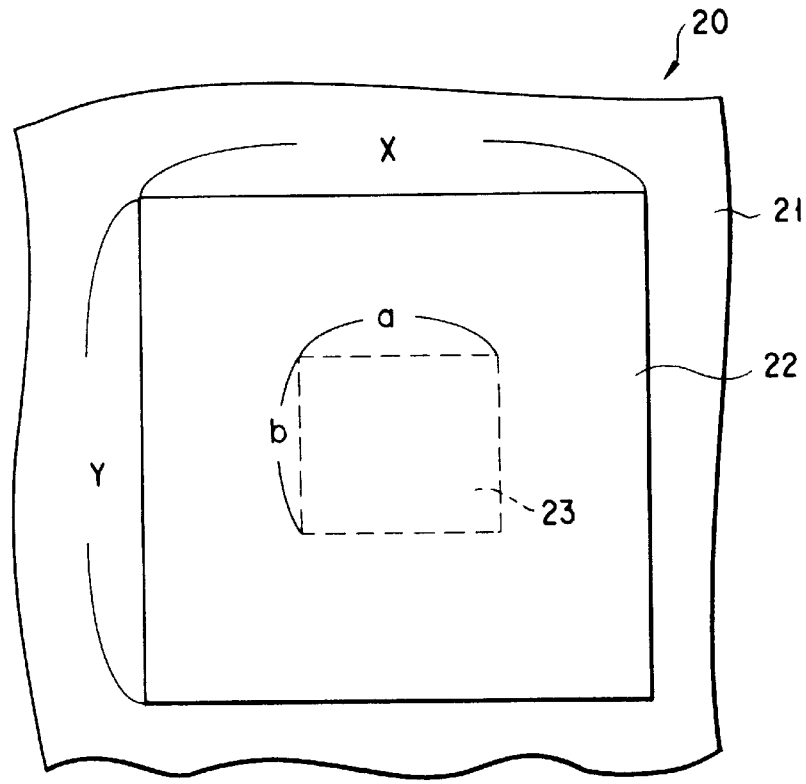
F I G. 2
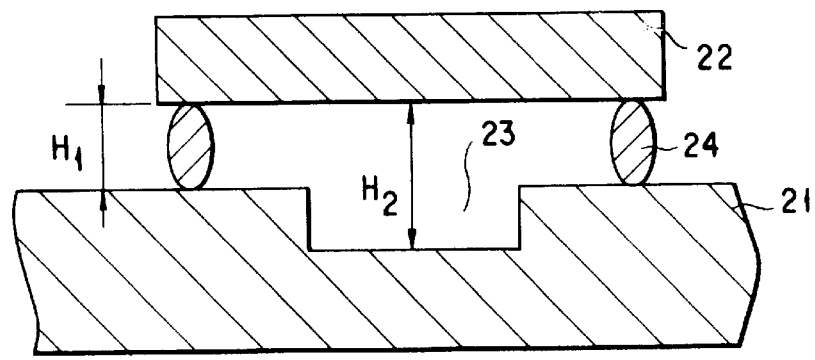
F I G. 3

A : BEFORE MOUNTING A SEMICONDUCTOR CHIP
B : AFTER MOUNTING A SEMICONDUCTOR CHIP
C : AFTER SEALING WITH A RESIN

A : BEFORE MOUNTING A SEMICONDUCTOR CHIP
B : AFTER MOUNTING A SEMICONDUCTOR CHIP
C : AFTER SEALING WITH A RESIN

SEMICONDUCTOR DEVICE

BACKGROUND OF THE INVENTION

1. Field of the Invention

This invention relates to a semiconductor device comprising a flip chip-mounted semiconductor chip.

2. Description of the Related Art

With an advancement in miniaturization and performance of electronic devices in recent years, a flip chip bonding is now extensively utilized in the mounting of a semiconductor chip. In view of improving the reliability of flip chip bonding of a semiconductor chip, a method of sealing a space between a semiconductor chip and a substrate with a resin has been commonly adopted as disclosed in the Lecture Paper C-448; Kakimoto et al, Power Amplification MMIC Mounting Technique by means of Flip Chip Method, published at the General Meeting held in 1995 by the Electronic Information Communication Institute.

FIG. 1 illustrates a schematic sectional view of a mounted structure of a semiconductor chip according to the prior art. As shown in FIG. 1, a semiconductor chip 3 bearing an interconnecting wiring 1 and an element 2 is flip chip-mounted on an interconnecting wiring board 6. The electrical connection is effected through a bump 7. A space formed between the semiconductor chip 3 and the wiring board 6 is filled with a sealing resin 4 thereby sealing the space. As for a material for the sealing resin 4, an epoxy-based resin is generally employed, the physical properties of the epoxy-based resin being typically 4.0 in relative dielectric constant and about 0.02 in dielectric dissipation factor.

There is a problem in this construction however that the resin filled between the semiconductor chip 3 and the wiring board 6 may give a bad influence on the properties of the interconnecting wirings or elements formed on the semiconductor chip 3. For example, even if there is any substantial change in characteristic impedance of wiring or current loss between before and after the mounting of a semiconductor chip, the characteristic impedance of wiring may be substantially changed or the current loss may be increased, once a resin is filled between the semiconductor chip 3 and the wiring board 6.

SUMMARY OF THE INVENTION

As explained above, the conventional semiconductor chip-mounting structure sealed with a resin is accompanied with a problem that, due to the influence of a sealing resin, the characteristic impedance of wiring or element may be changed or the current loss may be increased.

This invention has been accomplished in view of the circumstances mentioned above, and therefore an object of the present invention is to provide a semiconductor device which is capable of assuring the reliability of a semiconductor chip without damaging the characteristics of interconnecting wirings and elements formed on the semiconductor chip.

According to a first aspect of the present invention, there is provided a semiconductor device comprising an interconnecting wiring board having two main surfaces, a semiconductor chip flip chip-mounted on the wiring board and bearing at least either one of an interconnecting wiring and an element on a surface facing the wiring board, and a sealing resin filled in a space between the wiring board and the semiconductor chip, which is featured in that;

one main surface of the wiring board which faces at least either one of the wiring and the element formed on the surface of semiconductor chip comprises a non-planar region formed of at least one of a through hole, a concave portion and a convex portion; and a void of the sealing resin is formed in a space between the non-planar region of the wiring board and the semiconductor chip.

According to a second aspect of the present invention, there is provided a semiconductor device comprising an interconnecting wiring board having two main surfaces, a semiconductor chip flip chip-mounted on the wiring board and having at least either one of an interconnecting wiring and an element on a surface facing the wiring board, and a sealing resin filled in a space between the wiring board and the semiconductor chip, which is featured in that;

a patterned insulating film is formed on the semiconductor chip thereby forming thereon at least one non-planar region formed of one of a concave portion and a convex portion in the region of at least either one of the wiring and the element; and a void devoid of the sealing resin is formed in a space between the wiring board and the non-planar region.

According to a third aspect of the present invention, there is provided a semiconductor device comprising an interconnecting wiring board having two main surfaces, a semiconductor chip flip chip-mounted on the wiring board and bearing at least either one of an interconnecting wiring and an element on a surface facing the wiring board, and a sealing resin filled in a space between the wiring board and the semiconductor chip, which is featured in that;

one main surface of the wiring board which faces at least either one of the wiring and the element has a surface characteristics which is made poor in wettability to the sealing resin; and a void devoid of the sealing resin is formed in a space between the one main surface of the wiring board exhibiting a poor wettability and the semiconductor chip.

According to a fourth aspect of the present invention, there is provided a semiconductor device comprising an interconnecting wiring board having two main surfaces, a semiconductor chip flip chip-mounted on the wiring board and bearing at least either one of an interconnecting wiring and an element on a surface facing the wiring board, and a sealing resin filled in a space between the wiring board and the semiconductor chip, which is featured in that;

one main surface of the semiconductor chip having at least either one of the wiring and the element has surface characteristics made poor in wettability to the sealing resin; and a void devoid of the sealing resin is formed in a space between the one main surface of the semiconductor chip exhibiting a poor wettability and the wiring board.

It is now possible according to this invention to prevent the characteristic impedance of interconnecting wirings or elements on a semiconductor chip from being changed or lost due to the bad influence from a sealing resin, and to provide a semiconductor device of high reliability which is capable of retaining excellent properties of interconnecting wirings and elements formed on a semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a plan view showing a semiconductor device provided with a concave portion, as it is viewed from the semiconductor chip side;

FIG. 3 is a cross-sectional view schematically showing a semiconductor device where a semiconductor chip is mounted on an interconnecting wiring board provided with a concave portion;

DETAILED DESCRIPTION OF THE PREFERRED EMBODIMENTS

Figure 1:
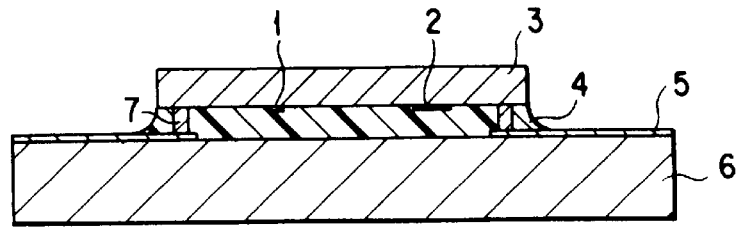
FIG. 1 is a cross-sectional view schematically showing one example of the conventional mounted structure of semiconductor chip.

According to a first aspect of the present invention, a non-planar region formed of a through hole, a concave portion or a convex portion is formed on part of the the surface of wiring board which faces the surface having at least either an interconnecting wiring or an element.

More specifically, according to a first aspect of the present invention, there is provided a semiconductor device comprising an interconnecting wiring board, a semiconductor chip flip chip-mounted on the wiring board and bearing at least either an interconnecting wiring or an element on a surface thereof which faces the wiring board, and a sealing resin filled in a space between the wiring board and the semiconductor chip, which is featured in that;

part of surface of said wiring board which faces at least either the wiring or the element formed on the surface of semiconductor chip is provided with at least one non-planar region formed of a through hole, a concave portion or a convex portion; and a void devoid of said sealing resin is formed in a space between said non-planar region of the wiring board and the semiconductor chip.

According to a second aspect of the present invention, a non-planar region formed of a concave portion or a convex portion is formed by using a patterned insulating film on an interconnecting wiring or an element of a semiconductor chip.

More specifically, according to a second aspect of the present invention, there is provided a semiconductor device comprising an interconnecting wiring board, a semiconductor chip flip chip-mounted on the wiring board and bearing at least either an interconnecting wiring and an element on a surface thereof which faces the wiring board, and a sealing resin filled in a space between the wiring board and the semiconductor chip, which is featured in that;

a patterned insulating film is formed on at least either the wiring or the element of the semiconductor chip thereby forming thereon at least one non-planar region formed of a concave portion or a convex portion; and a void devoid of said sealing resin is formed in a space between said wiring board and said non-planar region.

It is possible with the provision of a through hole, a concave portion or a convex portion to change a distance between the semiconductor chip and the wiring board. Since the sealing resin can be filled by using the most of capillary phenomenon, the filling velocity of the sealing resin can be varied depending on the viscosity of the sealing resin and on the height of a space between the semiconductor chip and the wiring board.

FIGS. 2 and 3 illustrate a filling velocity of a sealing resin in a space where a portion is formed therein. Specifically, FIG. 2 shows a plan view of a semiconductor device provided with a concave portion, as it is viewed from the semiconductor chip side; and FIG. 3 shows a schematical cross-sectional view of a semiconductor device where a semiconductor chip is mounted on an interconnecting wiring board provided with a concave portion.

As shown in FIGS. 2 and 3, the semiconductor device 20 comprises an interconnecting wiring board 21 provided on its surface with a concave portion 23 having dimensions of (a) by (b), and a semiconductor chip 22 having dimensions of (x) by (y) and mounted via bumps 24 on the wiring board 21. The concave portion 23 is formed at a region on the surface of the wiring board which faces at least one of the wiring and the element of semiconductor chip 22 and corresponds to the semiconductor chip area. As shown in FIG. 3, the height of the bump 24 and the distances between the concave portion 23 and the wiring board 21 are indicated by H1 and H2 respectively.

The velocity v2 of the sealing resin entering into the concave portion of such a semiconductor device 20 is lower than the velocity v1 of the sealing resin entering into the peripheral region around the concave, and can be represented by $v2=(H1/H2) \times v1$.

The formation of the void where the sealing resin is not filled in can be influenced not only by the existence of a concave portion but also by the size of the concave portion. For the purpose of forming a void, the magnitude of H2 should preferably be about at least twice as large as that of H1, and the length of each side (a) and (b) of the concave portion should preferably be about at least 10 times as large as that of H1.

The thickness of the semiconductor chip 22 should preferably be 100 to 635 $\mu$m in general, and the thickness in this embodiment is 250 $\mu$m for instance. The height of the bump 24, i.e. H1 should preferably be 20 to 60 $\mu$m, and the height in this embodiment is 50 $\mu$m for instance. The thickness of the wiring board 21 should preferably be 200 to 3000 $\mu$m in general, and the thickness in this embodiment is 1000 $\mu$m for instance.

In this case, the length of each side of (a) and (b) of the concave should preferably be 500 μm or more, more preferably in the range of 600 to 3000 μm, and the length in this embodiment is 1000 μm for instance. The distance H2 between the concave portion 23 and the wiring board 21 should preferably be 100 μm or more, more preferably in the range of 150 to 500 μm, and the distance in this embodiment is 200 μm for instance.

Figure 4:
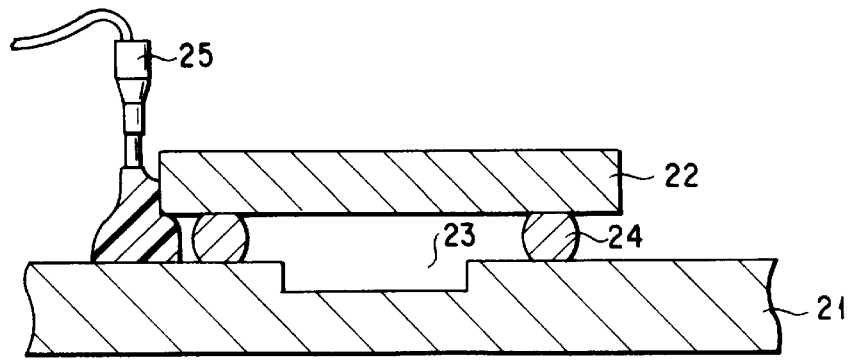
FIGS. 4 to 6 respectively shows a cross-sectional view illustrating a process of filling a sealing resin in a semiconductor device shown in FIGS. 2 and 3.
Figure 5:
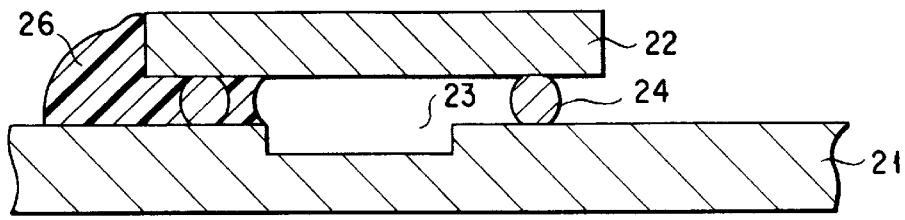
Figure 6:
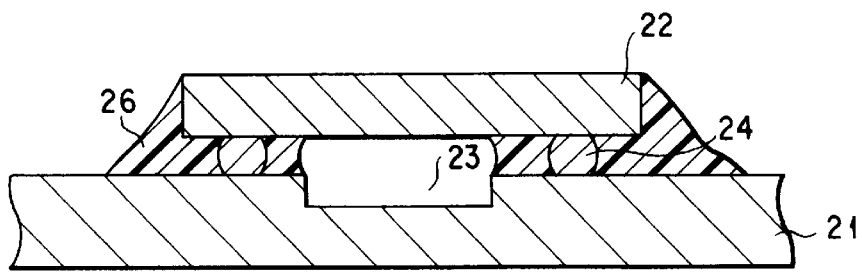

FIGS. 4 to 6 respectively shows a cross-sectional view illustrating a process of filling a sealing resin in a semiconductor device provided with an interconnecting wiring board having a concave portion formed thereon as shown in FIGS. 2 and 3.

First of all, as shown in FIG. 4, a sealing resin 26 is coated on an edge portion of one of the four sides of a square semiconductor chip by making use of a liquid delivery device 25 having a delivery rate control mechanism. As a result, as shown in FIG. 5, the sealing resin 26 thus coated is allowed to enter through capillary phenomenon into a space between the semiconductor chip 22 and the wiring board 21. In this case, since the filling velocity of the sealing resin 26 at the space over the concave portion 23 is relatively slow, the space around the concave portion 23 is filled first of all with the sealing resin 26 rather than the concave portion 23, resulting in the formation of a void over the concave portion 23 as shown in FIG. 6. Thereafter, the sealing resin thus filled is allowed to cure, thereby obtaining a semiconductor device sealed with a resin.

Figure 7:
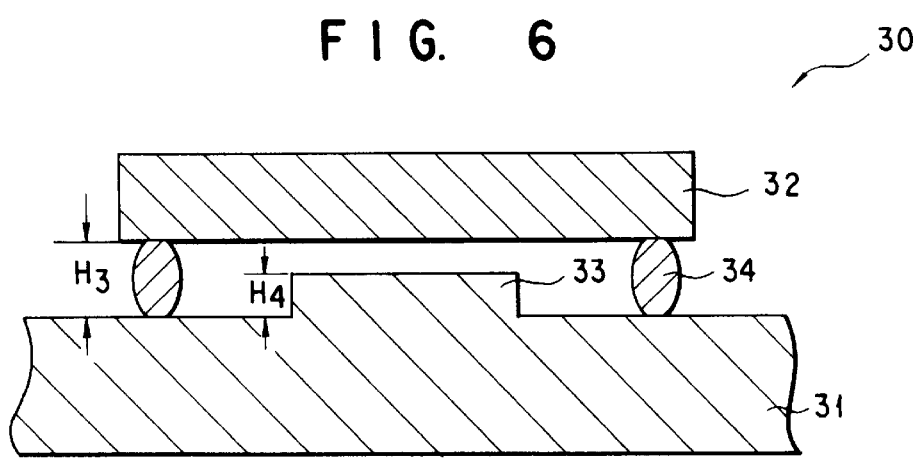
FIG. 7 is a cross-sectional view illustrating a filling velocity of sealing resin where a convex portion is formed in an interconnecting wiring board.

FIG. 7 illustrates a filling velocity when a convex portion is formed in a space to be filled with a resin. More specifically, FIG. 7 shows a cross-sectional view illustrating a filling velocity of sealing resin where a convex portion is formed in an interconnecting wiring board.

As shown in FIG. 7, the semiconductor device 30 comprises an interconnecting wiring board 31 provided on its surface with a convex portion 33 having a size of dimensions of (p) by (q), and a semiconductor chip 32 having a size of dimensions of (P) by (Q) and mounted via bumps 34 on the wiring board 31. The convex portion 33 is formed at a region on the surface of the wiring board which faces at least one of the wiring and the element of semiconductor chip 32 and corresponds to the semiconductor chip area. As shown in FIG. 7, the height of the bump 24 and the height of the convex portion 33 are indicated by H3 and H4 respectively.

The velocity v4 of the sealing resin entering over the convex portion of such a semiconductor device 30 is lower than the velocity v3 of the sealing resin entering into the peripheral region around the convex portion, and can be represented by $v4=\{(H3-H4)/H3\}^{1/2} \times v3$.

The formation of the void where the sealing resin is not filled in can be influenced not only by the existence of a convex portion but also by the size of the convex portion. For the purpose of forming a void, the magnitude of H4 should preferably be about not more than ¾ time as large as that of H3, and the length of each side (p) and (q) of the convex should preferably be about at least 10 times as large as that of H3.

The thickness of the semiconductor chip 32 should preferably be 100 to 635 μm in general, and the thickness in this embodiment is 250 μm for instance. The height of the bump 24, i.e. H3 should preferably be 20 to 60 μm, and the height in this embodiment is 50 μm for instance. The thickness of the wiring board 31 should preferably be 500 to 2000 μm in general, and the thickness in this embodiment is 1000 μm for instance.

In this case, the length of each side of (p) and (q) of the convex should preferably be 500 μm or more, more preferably in the range of 600 to 3000 μm, and the length in this embodiment is 1000 μm for instance. The height H4 of the convex portion 33 should preferably be in the range of 25 to 45 μm, and the height in this embodiment is 37 μm for instance.

When a through hole is formed in the wiring board, the velocity of the sealing resin entering into the through hole of a semiconductor device becomes lower than the velocity of the sealing resin entering into the peripheral region around the through hole.

The formation of the void where the sealing resin is not filled in can be influenced not only by the existence of a through hole but also by the size of the through hole. For the purpose of forming a void, the shorter diameter of through hole should preferably be about at least 10 times as large as the distance between the semiconductor chip and the wiring board.

As for the thickness of the semiconductor chip, the height of the bump and the thickness of the wiring board may be the same as those explained with reference to semiconductors shown in FIGS. 2, 3 and 7. The shorter diameter of the through hole should preferably be 500 μm or more, more preferably in the range of 700 to 1000 μm, and the diameter in this embodiment is 750 μm for instance.

It is possible to apply the non-planar region system which is employed in the first aspect of this invention to the semiconductor device of the second aspect of this invention.

According to a third aspect of the present invention, part of the surface of the wiring board which faces at least either the wiring or the element has a different surfaces property from other surface of the wiring board so as to make it poor in wettability to a sealing resin.

More specifically, according to a third aspect of this invention, there is provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

part of the surface of said wiring board which faces at least either the wiring or the element is made poor in wettability to said sealing resin; and a void devoid of said sealing resin is formed in a space between said part of surface of said wiring board exhibiting a poor wettability and said semiconductor chip.

According to a fourth aspect of the present invention, regions on the surface of the semiconductor chip where the wiring and the element are formed has a different surface property from other surface regions of the semiconductor chip so as to make them poorly wettable with a sealing resin.

More specifically, according to a fourth aspect of this invention, there is provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

part of the surface of said semiconductor chip bearing at least either the wiring or the element is made poor in wettability to said sealing resin; and a void devoid of said sealing resin is formed in a space between said part of the surface of said semiconductor chip exhibiting a poor wettability and said wiring board.

A sealing resin is infiltrated preferentially into a region formed of a surface having a good wettability to the sealing resin, so that, when the sealing resin is infiltrated into the space, a void can be formed over a region whose surface is poor in wettability to the sealing resin.

It is possible to combine the features according to the third aspect of this invention with the features according to the fourth aspect of this invention. In such a case, a surface region exhibiting a poor wettability to a sealing resin may be formed on both of the semiconductor chip and the wiring board.

More specifically, if the features according to the third aspect of this invention are combined with the features according to the fourth aspect of this invention, there will be provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

part of surface of the wiring board facing at least either the wiring or the element as well as part of surface of the semiconductor chip bearing at least either the wiring or the element are made poor in wettability to said sealing resin; and a void devoid of said sealing resin is formed in a space between said part of the surface of the wiring board exhibiting a poor wettability and said part of the surface of said semiconductor chip exhibiting a poor wettability.

It is also possible to apply the surface region exhibiting a poor wettability to a sealing resin according to the third and fourth aspects of this invention to the first and second aspects of this invention respectively.

More specifically, if the features according to the third aspect of this invention are combined with the features according to the first aspect of this invention, there will be provided a semiconductor device comprising an interconnecting wiring board, a semiconductor chip flip chip-mounted on the wiring board and bearing at least either an interconnecting wiring or an element on a surface thereof which faces the wiring board, and a sealing resin filled in a space between the wiring board and the semiconductor chip, which is featured in that;

part of surface of said wiring board which faces at least either the wiring or the element formed on the surface of semiconductor chip is provided with at least one non-planar region formed of a through hole, a concave portion or a convex portion and having a surface portion exhibiting a poor wettability to the sealing resin; and a void devoid of said sealing resin is formed in a space between said non-planar region of the wiring board and the semiconductor chip.

On the other hand, if the features according to the fourth aspect of this invention are combined with the features according to the first aspect of this invention, there will be provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

part of surface of said wiring board which faces at least either the wiring or the element formed on the surface of semiconductor chip is provided with at least one non-planar region formed of a through hole, a concave portion or a convex portion; part of surface of the semiconductor chip which faces said non-planar region of the wiring board is made to exhibit a poor wettability to the sealing resin; and a void devoid of said sealing resin is formed in a space between said non-planar region of the wiring board and the semiconductor chip.

Furthermore, if the features according to the third aspect of this invention are combined with the features according to the second aspect of this invention, there will be provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

a patterned insulating film is formed on the semiconductor chip thereby forming thereon at least one non-planar region formed of a concave portion or a convex portion in the region of at least either the wiring or the element; part of surface of said wiring board which faces said non-planar region is made to exhibit a poor wettability to the sealing resin as compared with other part of the surface of said wiring board; and a void devoid of said sealing resin is formed in a space between the wiring board and said non-planar region of the semiconductor chip.

On the other hand, if the features according to the fourth aspect of this invention are combined with the features according to the second aspect of this invention, there will be provided a semiconductor device comprising an interconnecting wiring board, a semiconductor chip flip chip-mounted on the wiring board and bearing at least either an interconnecting wiring or an element on a surface facing the wiring board, and a sealing resin filled in a space between the wiring board and the semiconductor chip, which is featured in that;

a patterned insulating film is formed on the semiconductor chip thereby forming thereon at least one non-planar region formed of a concave portion or a convex portion in the region of at least either the wiring or the element; a surface region exhibiting a poor wettability to the sealing resin is formed within the non-planar region of the semiconductor chip; and a void devoid of said sealing resin is formed in a space between the wiring board and said non-planar region of the semiconductor chip.

When the surface region exhibiting a poor wettability to a sealing resin according to the third and fourth aspects of this invention is applied to the first and second aspects of this invention, a void devoid of a sealing resin can be reliably formed in a space between the wiring board and the semiconductor chip.

As explained above, since a void devoid of a sealing resin is formed over elements or interconnecting wirings formed on a semiconductor chip according to a semiconductor device of this invention, any bad influence by the sealing resin on the properties of elements or interconnecting wirings can be effectively avoided and at the same time the quantity of the sealing resin to be employed for sealing the semiconductor device can be reduced.

This invention will be further explained with reference to the following specific examples.

Figure 8:
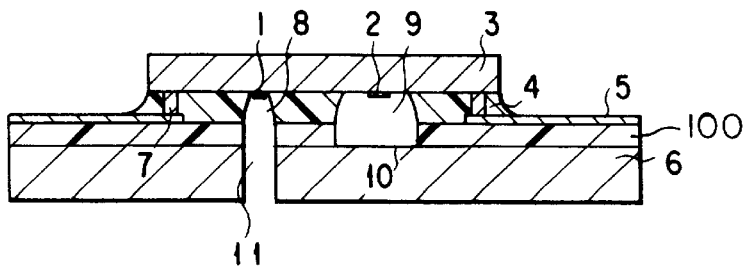
FIG. 8 is a cross-sectional view illustrating a semiconductor device according to a first embodiment of this invention.

FIG. 8 shows a cross-sectional view illustrating a semiconductor device according to a first embodiment of this invention. As shown in FIG. 8, a semiconductor chip 3 bearing an interconnecting wiring 1 and an element 2 thereon is placed on an interconnecting wiring board 6 having an interconnecting wiring 5 formed thereon, with the wiring 1 and the element 2 being faced to the surface of the wiring board 6. A bump 7 is interposed between the semiconductor chip 3 and the wiring board 6 thereby forming a space therebetween and at the same time providing an electrical connection therebetween. The space formed between the semiconductor chip 3 and the wiring board 6 is filled with a sealing resin 4. A concave portion 10 and a through hole 11 are formed on a region of the wiring board 6 which faces the wiring 1 of the semiconductor chip 3 and on another region of the wiring board 6 which faces the element 2, respectively. A void 8 devoid of a sealing resin is formed between the wiring 1 and the through hole 11, and another void 9 devoid of a sealing resin is formed between the element 2 and the concave portion 10.

The concave portion 10 in the semiconductor device shown in FIG. 8 can be formed by depositing an insulating film made of a dry film 110 on the entire surface of the wiring board, excluding the portion where the concave portion 10 is to be formed. As for the dry film 100, a film comprising acrylate or polyimide may be employed. The film thickness of the dry film 100 commercially available is generally in the range of 10 to 100 μm, but a dry film of any desired film thickness may be employed if necessary.

The height of a space between the semiconductor chip and the wiring board is made larger at the portion where the concave portion 10 is located as compared with other portions of the space, so that the velocity of the sealing resin entering into the space becomes slow at this concave portion 10 as compared with that in other portions, thus resulting in the formation of voids 8 and 9.

In the embodiment explained above, the voids are formed by making the most of the concave portion 10 or the through hole 11. However, these voids can be also formed by making the most of only the concave portion 10 or only the through hole 11. Further, although the concave portion 10 is formed by using a dry film 100 in the above embodiment, a solder resist or other kinds of resin film may be employed.

If desired, at least one portion selected from the surface of the concave portion 10, the side wall of the through hole and the surface portion of the semiconductor chip facing these portions may be turned into a surface (not shown) which is poor in wettability to a sealing resin.

Figure 9:
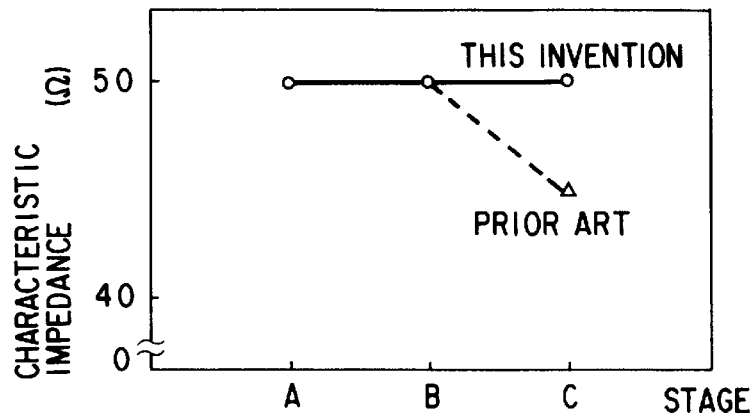
FIG. 9 is a graph illustrating a characteristic impedance of an interconnecting wiring formed on a semiconductor chip.
Figure 10:
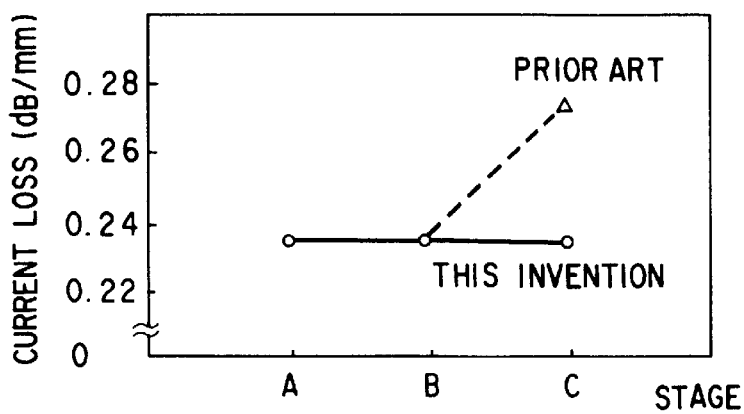
FIG. 10 is a graph illustrating a current loss of wiring formed on a semiconductor chip.

The conventional semiconductor device and the semiconductor device of this invention were tested on the change in characteristic impedance or current loss of wiring formed on a semiconductor chip at the following three stages: (A) Before mounting the semiconductor chip; (B) After the mounting of the semiconductor chip (before sealing with a resin); and (C) After the sealing of the semiconductor chip with a sealing resin. The results measured are shown in FIGS. 9 and 10. In these semiconductor devices tested, the semiconductor chip employed was formed of GaAs, and the wiring board employed was of an FR-4 resin board.

As apparent from FIGS. 9 and 10, in the conventional device, a change in characteristic impedance and an increase in current loss due to the filling of the sealing resin were recognized. By contrast, in the semiconductor device of this invention, any substantial change in characteristic impedance or any substantial increase in current loss were not recognized in any of three stages, i.e. (A), (B) and (C).

Figure 11:
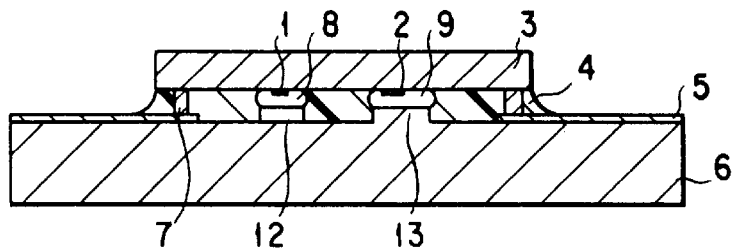
FIG. 11 is a cross-sectional view illustrating a semiconductor device embodying a first aspect of this invention.

FIG. 11 shows a cross-sectional view illustrating another example of a semiconductor device embodying a first aspect of this invention. As shown in FIG. 11, a convex portion 12 is formed at a region of the wiring board 6 facing the wiring formed on the semiconductor chip 3, and another convex portion 13 is formed at a region of the wiring board facing the element 2 formed on the semiconductor chip 3. A void 8 devoid of a sealing resin is formed between the wiring 1 and the convex portion 12, and another void 9 devoid of a sealing resin is formed between the element 2 and the convex portion 13.

The convex portions 12 and 13 in the semiconductor device shown in FIG. 11 can be formed by patterning an insulating film made of a dry film on the portion where the convex portions 12 and 13 are to be formed. The height of a space between the semiconductor chip and the wiring board is made smaller at the portion where the convex portions 12 and 13 are located as compared with other portions of the space, so that because the velocity of the sealing resin at convex portion 12, 13 is lower than that of the sealing resin in the other portion, it becomes difficult for the sealing resin to infiltrate the spaces where the convex portions 12 and 13 are located, thus allowing the voids 8 and 9 to be formed.

Figure 12:
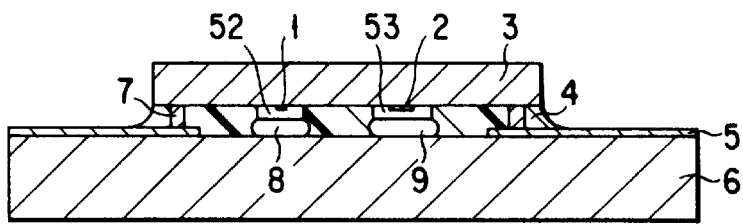
FIG. 12 is a cross-sectional view illustrating a semiconductor device embodying a second aspect of this invention.

FIG. 12 shows a cross-sectional view illustrating another example of a semiconductor device embodying a second aspect of this invention. As shown in FIG. 12, a convex portion 52 is formed at a region including the wiring 1 of the semiconductor chip 3, and another convex portion 53 is formed at a region including the element 2 of the semiconductor chip 3. A void 8 devoid of a sealing resin is formed between the convex portion 52 including the wiring 1 and a region of wiring board facing the convex portion 52, and another void 9 devoid of a sealing resin is formed between the convex portion 53 including the element 2 and a region of wiring board facing the convex portion 53.

These convex portions 52 and 53 in the semiconductor device shown in FIG. 12 can be formed by selectively depositing an insulating film made of a dry film on the portion where the convex portions 52 and 53 are to be formed. The height of a space between the semiconductor chip and the wiring board is made smaller at the portion where the convex portions 52 and 53 are located as compared with other portions of the space, so that when a sealing resin having a relatively high viscosity is employed as a resin 4, it becomes difficult for the sealing resin to infiltrate the spaces where the convex portions 52 and 53 are located, thus allowing the voids 8 and 9 to be formed.

If desired, at least one portion selected from the surface of the convex portion 52 and the surface portion of the wiring board facing these portions may be turned into a surface (not shown) which is poor in wettability to a sealing resin.

Figure 13:
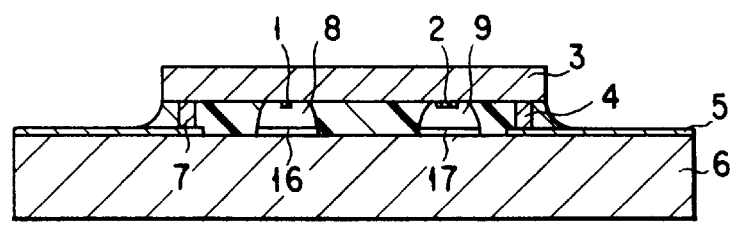
FIG. 13 is a cross-sectional view illustrating a semiconductor device embodying a third aspect of this invention.

FIG. 13 shows a cross-sectional view illustrating another example of a semiconductor device embodying a third aspect of this invention. As shown in FIG. 13, a pattern 16 consisting of a material exhibiting a poor wettability to a sealing resin such as Teflon resin film is formed at a region of the wiring board 6 facing the wiring formed on the semiconductor chip 3, and another pattern 17 consisting of a material exhibiting a poor wettability to a sealing resin such as Teflon resin film is formed at a region of the wiring board facing the element 2 formed on the semiconductor chip 3. A void 8 devoid of a sealing resin is formed between the wiring 1 and the pattern 16, and another void 9 devoid of a sealing resin is formed between the element 2 and the pattern 17.

According to a semiconductor device shown in FIG. 13, since it is difficult for the sealing resin to enter into the spaces where a surface exhibiting a poor wettability to the sealing resin are located, the voids 8 and 9 can be formed.

Figure 14:
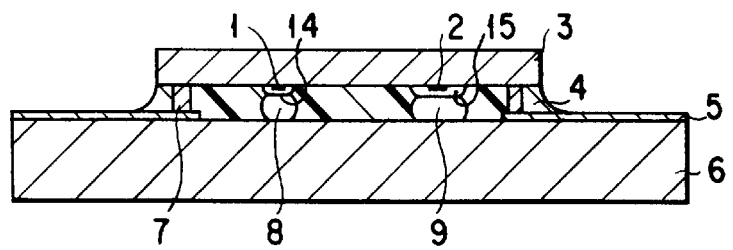
FIG. 14 is a cross-sectional view illustrating a semiconductor device embodying a fourth aspect of this invention.

FIG. 14 shows a cross-sectional view illustrating another example of a semiconductor device embodying a fourth aspect of this invention. As shown in FIG. 14, a pattern 14 consisting of a material exhibiting a poor wettability to a sealing resin such as Teflon resin film is formed at a region including the wiring 1 of the semiconductor chip 3, and another pattern 15 consisting of a material exhibiting a poor wettability to a sealing resin such as Teflon resin film is formed at a region including the element 2 of the semiconductor chip 3. A void 8 devoid of a sealing resin is formed between the pattern 14 including wiring 1 and a region of the wiring board facing the pattern 14, and another void 9 devoid of a sealing resin is formed between the pattern 15 including the element 2 and a region of the wiring board facing the pattern 15. According to a semiconductor device shown in FIG. 14, since it is difficult for the sealing resin to enter into the spaces where a surface exhibiting a poor wettability to the sealing resin are located, the voids 8 and 9 can be formed.

It is also possible according to this invention to concurrently form a region whose surface is poor in wettability to a sealing resin together with a concave portion and a convex portion on a semiconductor chip, and at the same time to concurrently form a region whose surface is poor in wettability to a sealing resin together with a through hole, a concave portion and a convex portion on an interconnecting wiring board.

Figure 15:
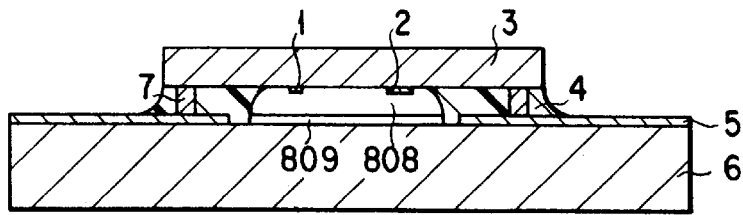
FIG. 15 is a cross-sectional view illustrating a semiconductor device where a wide void region is formed covering both an interconnecting wiring and an element.

Although a void devoid of a sealing resin is provided respectively at each of the region where an element or an interconnecting wiring are located in the above embodiments, it is also possible to provide a wide void 808 extending over both wiring 1 and element 2 by placing a pattern 809 consisting of a material exhibiting a poor wettability to a sealing resin such as Teflon resin film on a region of surface of the wiring board facing the wiring 1 and the element 2 of the semiconductor chip 3 as shown in FIG. 15.

Although Teflon resin film is exemplified for forming a region exhibiting a poor wettability to a sealing resin in the above embodiments, it is also possible to employ a hydrocarbon-based wax, a fatty acid-based wax, a fatty acid amide-based wax or an ester-based wax for the formation of such a region exhibiting a poor wettability to a sealing resin.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising an interconnecting wiring board, a semiconductor chip flip chip-mounted on the wiring board having an effective region in which at least either one of an interconnecting wiring and an element on a surface facing the wiring board is provided and having a non-effective region surrounding said effective region, and a sealing resin filled in a space between the wiring board and the semiconductor chip, wherein;

said effective region has a region in which said sealing resin is formed and a region in which said sealing resin is not formed, and part of a surface of said wiring board which faces at least either one of the wiring and the element formed on the surface of the semiconductor chip comprises one non-planar region formed of at least one of a through hole, a concave portion and a convex portion; and a void devoid of said sealing resin is formed at least in a space between said non-planar region of the wiring board and the semiconductor chip.

2. The semiconductor device according to claim 1, wherein a region having a surface which is poor in wettability to the sealing resin is further formed in said non-planar region.

3. The semiconductor device according to claim 2, wherein said region having a surface which is poor in wettability to the sealing resin is formed of at least one material selected from the group consisting of Teflon resin, a hydrocarbon-based wax, a fatty acid-based wax, a fatty acid amide-based wax and an ester-based wax.

4. The semiconductor device according to claim 1, wherein a region which is poor in wettability to the sealing resin is further formed on part of surface of said semiconductor chip facing said non-planar region.

5. The semiconductor device according to claim 4, wherein said region which is poor in wettability to the sealing resin is formed of at least one material selected from the group consisting of Teflon resin, a hydrocarbon-based wax, a fatty acid-based wax, a fatty acid amide-based wax and an ester-based wax.

6. The semiconductor device according to claim 1, wherein said convex portion is made of a dry film consisting of one of acrylate and polyimide.

7. The semiconductor device according to claim 1, wherein a shorter diameter of said through hole, said concave portion and a convex portion is at least 10 times as large as a distance between the semiconductor chip and the wiring board.

8. The semiconductor device according to claim 1, wherein a distance between said concave portion and said semiconductor chip is at least 2 times as large as that between said wiring board and said semiconductor chip.

9. The semiconductor device according to claim 1, wherein a distance between said convex portion and said semiconductor chip is not more than ¾ times as large as that between said wiring board and said semiconductor chip.

10. The semiconductor device according to claim 1, wherein said concave portion is surrounded by a dry film consisting of one of acrylate and polyimide.

11. A semiconductor device comprising an interconnecting wiring board, a semiconductor chip flip chip-mounted on the wiring board having an effective region in which at least either one of an interconnecting wiring and an element on a surface facing the wiring board is provided and having a non-effective region surrounding said effective region, and a sealing resin filled in a space between the wiring board and the semiconductor chip, wherein;

said effective region has a region in which said sealing resin is formed and a region in which said sealing resin is not formed, and a patterned insulating film is formed on the semiconductor chip thereby forming thereon at least one non-planar region formed of one of a concave portion and a convex portion in the region of at least either one of the wiring and the element; and a void devoid of said sealing resin is formed at least in a space between said wiring board and said non-planar region.

12. The semiconductor device according to claim 11, wherein a region having a surface which is poor in wettability to the sealing resin is further formed in a region of a surface of said wiring board facing said non-planar region.

13. The semiconductor device according to claim 12, wherein said region having a surface which is poor in wettability to the sealing resin is formed of at least one material selected from the group consisting of Teflon resin, a hydrocarbon-based wax, a fatty acid-based wax, a fatty acid amide-based wax and an ester-based wax.

14. The semiconductor device according to claim 11, wherein a region which is poor in wettability to the sealing resin is further formed in said non-planar region.

15. The semiconductor device according to claim 14, wherein said region which is poor in wettability to the sealing resin is formed of at least one material selected from the group consisting of Teflon resin, a hydrocarbon-based wax, a fatty acid-based wax, a fatty acid amide-based wax and an ester-based wax.

16. The semiconductor device according to claim 11, wherein said convex portion is made of a dry film consisting of one of acrylate and polyimide.

17. The semiconductor device according to claim 11, wherein a shorter diameter of said concave portion and a convex portion is at least 10 times as large as a distance between the semiconductor chip and the wiring board.

18. The semiconductor device according to claim 11, wherein a distance between said concave portion and said semiconductor chip is at least 2 times as large as that between said wiring board and said semiconductor chip.

19. The semiconductor device according to claim 11, wherein a distance between said convex portion and said semiconductor chip is not more than ¾ times as large as that between said wiring board and said semiconductor chip.

20. The semiconductor device according to claim 11, wherein said concave portion is surrounded by a dry film consisting of one of acrylate and polyimide.

21. A semiconductor device comprising an interconnecting wiring board, a semiconductor chip flip chip-mounted on the wiring board having an effective region in which at least either one of an interconnecting wiring and an element on a surface facing the wiring board is provided and having a non-effective region surrounding said effective region, and a sealing resin filled in a space between the wiring board and the semiconductor chip, wherein;

said effective region has a region in which said sealing resin is formed and a region in which said sealing resin is not formed, and part of a surface of said wiring board which faces at least either one of the wiring and the element has surface characteristics made poor in wettability to said sealing resin; and a void devoid of said sealing resin is formed at least in a space between said part of the surface exhibiting a poor wettability and said semiconductor chip.

22. The semiconductor device according to claim 21, wherein said region having a surface which is poor in wettability to the sealing resin is formed of at least one material selected from the group consisting of Teflon resin, a hydrocarbon-based wax, a fatty acid-based wax, a fatty acid amide-based wax and an ester-based wax.

23. A semiconductor device comprising an interconnecting wiring board, a semiconductor chip flip chip-mounted on the wiring board having an effective region in which at least either one of an interconnecting wiring and an element on a surface facing the wiring board is provided and having a non-effective region surrounding said effective region, and a sealing resin filled in a space between the wiring board and the semiconductor chip, wherein;

said effective region has a region in which said sealing resin is formed and a region in which said sealing resin is not formed, and part of a surface of said semiconductor chip bearing at least either one of the wiring and the element has surface characteristics made poor in wettability to said sealing resin; and a void devoid of said sealing resin is formed at least in a space between said part of the surface of said semiconductor chip exhibiting a poor wettability and said wiring board.

24. The semiconductor device according to claim 23, wherein said region having a surface which is poor in wettability to the sealing resin is formed of at least one material selected from the group consisting of Teflon resin, a hydrocarbon-based wax, a fatty acid-based wax, a fatty acid amide-based wax and an ester-based wax.

* * * * *